United States Patent [19]

DeBoer

[11] Patent Number: 5,126,760
[45] Date of Patent: Jun. 30, 1992

[54] DIRECT DIGITAL HALFTONE COLOR PROOFING INVOLVING DIODE LASER IMAGING

[75] Inventor: Charles D. DeBoer, Rochester, N.Y.

[73] Assignee: Eastman Kodak Company, Rochester, N.Y.

[21] Appl. No.: 514,643

[22] Filed: Apr. 25, 1990

[51] Int. Cl.$^5$ .............................................. H04N 1/21
[52] U.S. Cl. .................................. 346/108; 250/312.1
[58] Field of Search .................... 346/1.1, 108, 110 R; 250/317.1

[56] References Cited

U.S. PATENT DOCUMENTS 3,833,441 9/1974 Heiart ................................ 250/317.1

FOREIGN PATENT DOCUMENTS 2083726 3/1982 United Kingdom .

Primary Examiner—Mark J. Reinhart
Attorney, Agent, or Firm—Harold E. Cole

[57] ABSTRACT

A process is described for producing a direct digital, halftone color proof of an original image on a dye-receiving element, the proof being used to represent a printed color image obtained from a printing press, comprising:
a) generating a set of electrical signals which is representative of the shape and color scale of an original image;
b) contacting a dye-donor element comprising a support having thereon a dye layer and an infrared-absorbing material with a first dye-receiving element comprising a support having thereon a polymeric, dye image-receiving layer;
c) using the signals to imagewise-heat by means of a diode laser the dye-donor element, thereby transferring a dye image to the first dye-receiving element; and
d) retransferring the dye image to a second dye image-receiving element which has the same substrate as the printed color image.

6 Claims, No Drawings

DIRECT DIGITAL HALFTONE COLOR PROOFING INVOLVING DIODE LASER IMAGING

This invention relates to a process for obtaining a halftone color proof using diode laser imaging which is to be used to represent a printed color image obtained from a printing press.

In order to approximate the appearance of continuous-tone (photographic) images via ink-on-paper printing, the commercial printing industry relies on a process known as halftone printing. In halftone printing, color density gradations are produced by printing patterns of dots of various sizes, but of the same color density, instead of varying the color density uniformly as is done in photographic printing.

There is an important commercial need to obtain a halftone color proof image before a printing press run is made. It is desired that the color proof will accurately represent the image quality, details, color tone scale and the halftone pattern of the prints obtained on the printing press. In the sequence of operations necessary to produce an ink-printed, full-color picture, a halftone proof is also required to check the accuracy of the color separation data from which the final three or more printing plates or cylinders are made. Traditionally, such color separation proofs have involved silver halide photographic, high-contrast lithographic systems or non-silver halide light-sensitive systems which require many exposure and processing steps before a final, full-color picture is assembled.

More recently, color electronic pre-press systems have been used to compose, combine, edit or otherwise manipulate digital color separation data. It would be desirable to be able to prepare a halftone color proof directly from the digital color separation data without going through photographic exposure and processing steps.

One direct digital color proofing system commercially available is electrostatic. However, it is difficult to control the charge in this system which gives rise to inconsistent blotchy areas that make image evaluation difficult.

The use of a signal-modulated laser to make a halftone color proof is described in GB 2,083,726A. The laser described therein, however, is a YAG laser which is inherently unstable and expensive. Such a laser also requires a complex modulation apparatus that makes inefficient use of the laser power. Also, this reference discloses the use of a carbon dispersion as an infrared absorber. There is a problem with using carbon as the absorbing material in that it is particulate and has a tendency to clump when coated which may degrade the transferred dye image. Also, carbon may transfer to the receiver by sticking or ablation, causing a mottled or desaturated color image. Further, there is no disclosure in this reference of forming a halftone color proof by retransferring the dye image to a second receiver which has the same substrate as the printed color image to be obtained on the printing press.

In accordance with this invention, a process is described for producing a direct digital, halftone color proof of an original image on a dye-receiving element, the proof being used to represent a printed color image obtained from a printing press, comprising:

a) generating a set of electrical signals which is representative of the shape and color scale of an original image;
b) contacting a dye-donor element comprising a support having thereon a dye layer and an infrared-absorbing material with a first dye-receiving element comprising a support having thereon a polymeric, dye image-receiving layer;
c) using the signals to imagewise-heat by means of a diode laser the dye-donor element, thereby transferring a dye image to the first dye-receiving element; and
d) retransferring the dye image to a second dye image-receiving element which has the same substrate as the printed color image.

In the above process, multiple dye-donors may be used to obtain as many colors as desired in the proof. For example, for a full-color proof, four colors: cyan, magenta, yellow and black are normally used.

By using the above process, the dye is transferred by heating the dye-donor containing the infrared-absorbing material with the diode laser to volatilize the dye, the diode laser beam being modulated by the set of signals which is representative of the shape and color of the original image, so that the dye is heated to cause volatilization only in those areas in which its presence is required on the dye-receiving layer to reconstruct the color of the original image.

The diode lasers used in this invention offer substantial advantages in terms of their small size, low cost, stability, reliability, ruggedness, and ease of modulation. In practice, before any laser can be used to heat a dye-donor element containing the infrared-absorbing material, the laser radiation must be absorbed into the dye layer and converted to heat by a molecular process known as internal conversion. Thus, the construction of a useful dye layer will depend not only on the hue, sublimability and intensity of the image dye, but also on the ability of the dye layer to absorb the radiation and convert it to heat.

Diode lasers have excellent resolution and can be focused to a spot size equivalent to the micropixel size of the dots of the proof (up to 2400 dots/inch). Diode lasers are long-lived and can be rapidly and easily modulated. A resistive thermal head would be impractical in this use as it would not give adequate resolution. The diode laser beam may also be focused through a transparent support.

Lasers which can be used to transfer dye from dye-donors employed in the invention are available commercially. There can be employed, for example, Laser Model SDL-2420-H2 from Spectra Diode Labs, or Laser Model SLD 304 V/W from Sony Corp.

A thermal printer which uses the laser described above to form an image on a thermal print medium is described and claimed in copending U.S. application Ser. No. 451,656 of Baek and DeBoer, filed Dec. 18, 1989, the disclosure of which is hereby incorporated by reference.

Spacer beads may be employed in a separate layer over the dye layer of the dye-donor in order to separate the dye-donor from the dye-receiver during dye transfer, thereby increasing its uniformity and density. That invention is more fully described in U.S. Pat. No. 4,772,582, the disclosure of which is hereby incorporated by reference. The spacer beads may be coated with a polymeric binder if desired. Alternatively, the spacer beads may be employed in the receiving layer of the dye-receiver as described in U.S. Pat. No. 4,876,235, the disclosure of which is hereby incorporated by reference.

In a preferred embodiment of the invention, an infrared-absorbing dye is employed in the dye-donor element instead of carbon black in order to avoid desaturated colors of the imaged dyes from carbon contamination. The use of an absorbing dye also avoids problems of uniformity due to inadequate carbon dispersing. For example, cyanine infrared absorbing dyes may be employed as described in U.S. Pat. No. 4,973,572 the disclosure of which is hereby incorporated by reference. Other materials which can be employed are described in the following U.S. Pat. Nos. 4,948,777, 5,035,977, 4,950,640, 4,950,639, 4,948,776, 5,019,480, 5,034,303, 4,948,778, 4,942,141, 4,952,552, 5,036,040 and 4,912,083.

The use of dyes in the dye-donor rather than pigments permits a wide selection of hue and color that enables a closer match to a variety of printing inks and also permits easy transfer of images one or more times to a receiver if desired. The use of dyes also allows easy modification of density to any desired level.

Any dye can be used in the dye-donor employed in the invention provided it is transferable to the dye-receiving layer by the action of the laser. Especially good results have been obtained with sublimable dyes such as anthraquinone dyes, e.g., Sumikalon Violet RS ® (product of Sumitomo Chemical Co., Ltd.), Dianix Fast Violet 3R-FS ® (product of Mitsubishi Chemical Industries, Ltd.), and Kayalon Polyol Brilliant Blue N-BGM ® and KST Black 146 ® (products of Nippon Kayaku Co., Ltd.); azo dyes such as Kayalon Polyol Brilliant Blue BM ®, Kayalon Polyol Dark Blue 2BM ®, and KST Black KR ® (products of Nippon Kayaku Co., Ltd.), Sumickaron Diazo Black 5G ® (product of Sumitomo Chemical Co., Ltd.), and Miktazol Black 5GH ® (product of Mitsui Toatsu Chemicals, Inc.); direct dyes such as Direct Dark Green B ® (product of Mitsubishi Chemical Industries, Ltd.) and Direct Brown M ® and Direct Fast Black D ® (products of Nippon Kayaku Co. Ltd.); acid dyes such as Kayanol Milling Cyanine 5R ® (product of Nippon Kayaku Co. Ltd.); basic dyes such as Sumicacryl Blue 6G ® (product of Sumitomo Chemical Co., Ltd.), and Aizen Malachite Green ® (product of Hodogaya Chemical Co., Ltd.);

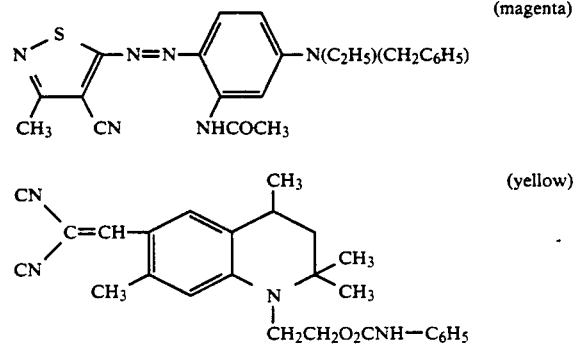

(magenta)

(yellow)

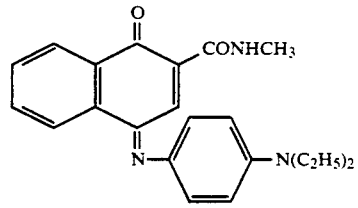

(cyan)

or any of the dyes disclosed in U.S. Pat. Nos. 4,541,830, 4,698,651, 4,695,287, 4,701,439, 4,757,046, 4,743,582, 4,769,360, and 4,753,922, the disclosures of which are hereby incorporated by reference. The above dyes may be employed singly or in combination. The dyes may be used at a coverage of from about 0.05 to about 1 g/m$^2$ and are preferably hydrophobic.

The dye in the dye-donor employed in the invention is dispersed in a polymeric binder such as a cellulose derivative, e.g., cellulose acetate hydrogen phthalate, cellulose acetate, cellulose acetate propionate, cellulose acetate butyrate, cellulose triacetate or any of the materials described in U.S. Pat. No. 4,700,207; a polycarbonate; polyvinyl acetate, poly(styrene-co-acrylonitrile), a poly(sulfone) or a poly(phenylene oxide). The binder may be used at a coverage of from about 0.1 to about 5 g/m$^2$.

The dye layer of the dye-donor element may be coated on the support or printed theron by a printing technique such as a gravure process.

Any material can be used as the support for the dye-donor element employed in the invention provided it is dimensionally stable and can withstand the heat of the laser. Such materials include polyesters such as poly(ethylene terephthalate); polyamides; polycarbonates; cellulose esters such as cellulose acetate; fluorine polymers such as polyvinylidene fluoride or poly(tetrafluoroethylene-co-hexafluoropropylene); polyethers such as polyoxymethylene; polyacetals; polyolefins such as polystyrene, polyethylene, polypropylene or methylpentane polymers; and polyimides such as polyimide-amides and polyether-imides. The support generally has a thickness of from about 5 to about 200 μm. It may also be coated with a subbing layer, if desired, such as those materials described in U.S. Pat. Nos. 4,695,288 or 4,737,486.

The use of an intermediate receiver with subsequent retransfer to a second receiving element which has the same substrate as that used for the printing press is an important feature of the invention. A multitude of different substrates can be used to prepare the color proof (the second receiver) which is the same substrate used for the printing press run. However, there needs to be only one intermediate receiver for the process of the invention. Thus, this one intermediate receiver can be optimized for efficient dye uptake without dye-smearing or crystallization. In the retransfer step, the dyes and receiver binder may be transferred to the second receiver, or the dyes alone may be transferred as desired. In a preferred embodiment of the invention, both the dye and receiver binder are transferred to the second dye image-receiving element.

The intermediate or first dye-receiving element that is used with the dye-donor element employed in the invention comprises a support having thereon a dye image-receiving layer. The support may be a transparent film such as a poly(ether sulfone), a polyimide, a cellulose ester such as cellulose acetate, a poly(vinyl alcohol-co-acetal) or a poly(ethylene terephthalate).

The dye image-receiving layer may comprise, for example, a polycarbonate, a polyurethane, a polyester, polyvinyl chloride, cellulose esters such as cellulose acetate butyrate or cellulose acetate propionate, poly(styrene-co-acrylonitrile), poly(caprolactone) or mixtures thereof, or any material provided it will transfer to the second receiver. The dye image-receiving layer may be present in any amount which is effective for the intended purpose. In general, good results have been obtained at a concentration of from about 1 to about 5 $g/m^2$.

Examples of substrates which may be used for the second receiving element (color proof) include the following: Flo Kote Cove ® (S. D. Warren Co.), Champion Textweb ® (Champion Paper Co.), Quintessence Gloss ® (Potlatch Inc.), Vintage Gloss ® (Potlatch Inc.), Khrome Kote ® (Champion Paper Co.), Consolith Gloss ® (Consolidated Papers Co.) and Mountie Matte ® (Potlatch Inc.).

As noted above, after the dye image is obtained on a first dye-receiving element, it is retransferred to a second dye image-receiving element. This can be accomplished, for example, by passing the two receivers between a pair of heated rollers. Other methods of retransferring the dye image could also be used such as using a heated platen, use of pressure and heat, external heating, etc.

Also as noted above, a set of electrical signals is generated which is representative of the shape and color of an original image. This can be done, for example, by scanning an original image, filtering the image to separate it into the desired basic colors-red, blue and green, and then converting the light energy into electrical energy. The electrical signals are then modified by computer to form the color separation data which is used to form a halftone color proof. Instead of scanning an original object to obtain the electrical signals, the signals may also be generated by computer. This process is described more fully in Graphic Arts Manual, Janet Field ed., Arno Press, New York 1980 (p. 358ff), the disclosure of which is hereby incorporated by reference.

The following example is provided to illustrate the invention.

EXAMPLE 1

A conventional photographic negative image (cyan, yellow and magenta imaging dyes with colored coupler dye hue correction) was the originating material for both a continuous tone laser thermal dye-transfer color image and a halftone color proof image on a substrate equivalent to that used for the press run on a printing press.

In each instance, the color photographic negative was first scanned to convert the image into a digitized individual pixel color separated image. This procedure is described in the Graphic Arts Manual article referred to above.

For the color proof halftone only, the pixel values were converted into a halftone bit map according to a program as described in "Electronic Imaging in the Graphic Arts", SPIE Proceedings Vol. 1073, K. S. Cloud, ed., "The design of a Graphic Arts Halftone Screening Computer", by L. G. Wash and J. F. Hamilton, Jr. pgs. 26–60. The screen angles which were used were 15 degrees for the cyan, 45 degrees for the magenta and 75 degrees for the yellow. There was no black. A further description of screen angles and their importance are also described in the Graphic Arts Manual referred to above on page 347. The screen ruling was 150 lines per inch and the sub-pixel matrix was at 1800 lines per inch.

Both the continuous tone and halftone composite color images were printed from dye-donors as described below onto a receiver using a single diode laser drum printer as described in U.S. Pat. No. 4,876,235.

The diode laser used was a Spectra Diode Labs SDL-2430-H2 model with a 100 micron diameter optical fiber output of 250 mW. The laser beam was imaged onto the film plane with a 0.33 magnification lens, giving a nominal spot size of 33 microns. The wavelength of the laser was 820 nm. The drum was 312 mm in circumference and the rotation speed was 250 rpm, giving a line writing speed of 130 cm/sec. This calculates to a dwell time of 25 microseconds per 33 micron spot. The donor and receiver sheets were held on the drum with tape to ensure good contact as evidenced by slight deformation of the support showing the polystyrene beads contained in the receiver as described below.

The three color images were printed in register from three dye-donors containing individual dyes. After the first dye was transferred, the elements were peeled apart. The second dye-donor element was then brought in register with the dye-receiving element and the process repeated. The third color was obtained in the same manner.

A) A cyan dye-donor was prepared by coating on a 100 μm gelatin-subbed poly(ethylene terephthalate) support:

A dye layer containing the cyan dyes illustrated below, each at 0.41 $g/m^2$, the cyanine infrared absorbing dye illustrated below (0.18 $g/m^2$) and Dow Corning DC-510 ® surfactant (0.0001 $g/m^2$) in a cellulose acetate propionate (2.5% acetyl, 45% propionyl) binder (0.41 $g/m^2$) coated from a cyclohexanone, butanone and dimethylformamide solvent mixture.

B) A magenta dye-donor was prepared as in A) except that the magenta dyes illustrated below were employed at 0.27 $g/m^2$, the infrared absorbing dye at 0.14 $g/m^2$ and the binder at 0.27 $g/m^2$.

C) A yellow dye-donor was prepared as in A) except that the yellow dyes illustrated below were employed at 0.20 $g/m^2$, the infrared absorbing dye at 0.14 $g/m^2$ and the binder at 0.20 $g/m^2$.

Cyan Dye A

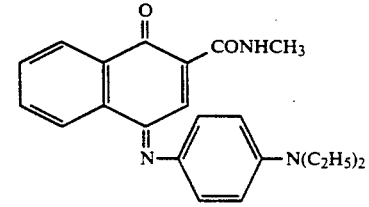

Cyan Dye B

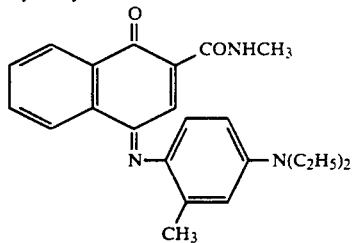

Cyanine Infrared Absorbing Dye

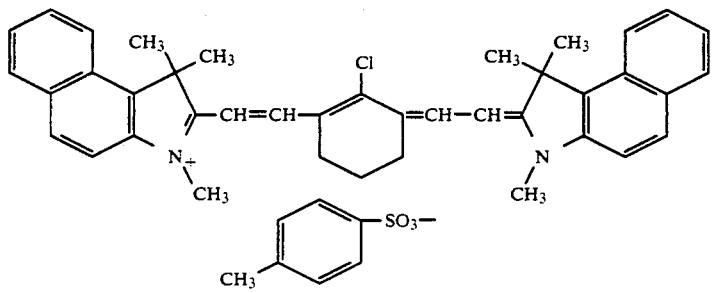

Magenta Dye C

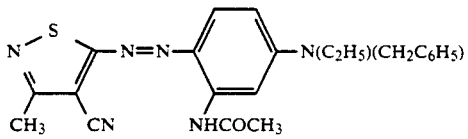

Magenta Dye D

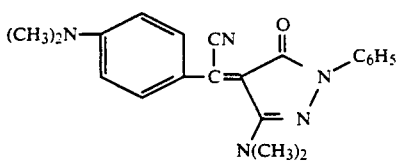

Yellow Dye E

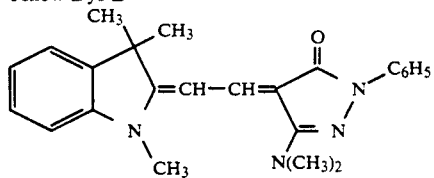

Yellow Dye F

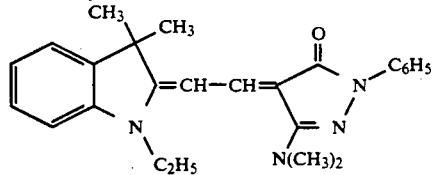

An intermediate dye-receiving element was prepared by coating on an unsubbed 100 μm thick poly(ethylene terephthalate) support a layer of polystyrene beads (14 μm average diameter)(0.11 g/m²) and triethanolamine (0.09 g/m²) in a cellulose acetate butyrate binder (30% acetyl, 17% butyryl)(3.2 g/m²).

After exposure of the halftone digitized image onto the intermediate receiver using the laser exposing device, the intermediate receiver was laminated to Quintessence Gloss ® (Potlatch Co.) 80 pound stock paper by passage through a pair of heated moving rollers at 120° C.

A continuous density halftone cyan scale was also printed along with the picture image. This produced a measured density of 1.43 in the darkest portion of the scale and 0.11 in the lightest portion of the scale.

The continuous tone comparison image was printed in a similar manner from the digitized scanned image.

A comparison of the continuous tone and halftone images indicated good sharpness and recognition of details in both images. Under magnification, dots of variable size are readily apparent in the halftone image.

The invention has been described in detail with particular reference to preferred embodiments thereof, but it will be understood that variations and modifications can be effected within the spirit and scope of the invention.

What is claimed is:

1. A process for producing a direct digital, halftone color proof of an original image on a dye-receiving element, said proof being used to represent a printed color image obtained from a printing press, comprising:

a) generating a set of electrical signals which is representative of the shape and color scale of said original image;

b) contacting a dye-donor element comprising a support having thereon a dye layer and an infrared-absorbing material with a first dye-receiving element comprising a support having thereon a polymeric, dye image-receiving layer;

c) using said signals to imagewise-heat by means of a diode laser said dye-donor element, thereby transferring a dye image to said first dye-receiving element; and d) retransferring said dye image to a second dye image-receiving element which has the same substrate as said printed color image.

2. The process of claim 1 wherein cyan, yellow, magenta and black dye-donor elements are employed to produce a halftone full color proof.

3. The process of claim 1 wherein each said dye-donor element contains an infrared-absorbing dye in said dye layer.

4. The process of claim 3 wherein said infrared-absorbing dye is a cyanine dye.

5. The process of claim 1 wherein spacer beads are employed in the dye-receiving layer of the dye-receiver during dye transfer by said laser.

6. The process of claim 1 wherein both said dye and receiver binder are transferred to said second dye image-receiving element.

* * * * *